US009575522B2

(12) United States Patent
Seo et al.

(10) Patent No.: US 9,575,522 B2
(45) Date of Patent: Feb. 21, 2017

(54) MOBILE TERMINAL AND MANUFACTURING METHOD FOR HEAT SPREADER MODULE

(71) Applicant: LG ELECTRONICS INC., Seoul (KR)

(72) Inventors: Dongup Seo, Seoul (KR); Duil Kim, Seoul (KR); Injoong Kim, Seoul (KR); Joungwook Park, Seoul (KR); Changwoo Song, Seoul (KR); Byungsoo Kim, Seoul (KR); Youngjin Park, Seoul (KR); Donghyun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 25 days.

(21) Appl. No.: 14/302,635

(22) Filed: Jun. 12, 2014

(65) Prior Publication Data

US 2015/0062823 A1  Mar. 5, 2015

(30) Foreign Application Priority Data

Sep. 3, 2013  (KR) .......................... 10-2013-0105302

(51) Int. Cl.
*G06F 1/20* (2006.01)
*B32B 38/10* (2006.01)
(Continued)

(52) U.S. Cl.
CPC ............... *G06F 1/203* (2013.01); *B32B 38/10* (2013.01); *B32B 38/18* (2013.01); *G06F 1/1637* (2013.01)

(58) Field of Classification Search
CPC .................................. G06F 1/20; G06F 1/203
(Continued)

(56) References Cited

U.S. PATENT DOCUMENTS 6,744,186 B2 * 6/2004 Oishi ................. H05K 7/20963
313/46
7,315,451 B2 * 1/2008 Kim .................... H05K 7/20963
313/46
(Continued)

FOREIGN PATENT DOCUMENTS

EP       1 775 741 A1      4/2007
JP       2005-338541 A    12/2005
WO      WO 01/41522 A1    6/2001

OTHER PUBLICATIONS

European Search Report issued in Application No. 14002655.0 dated Apr. 28, 2015.

*Primary Examiner* — Anthony Haughton
(74) *Attorney, Agent, or Firm* — KED & Associates LLP

(57) ABSTRACT

There is disclosed a mobile terminal including a display panel, a frame comprising a front surface where the display panel is disposed, a rear case coupled to one surface of the frame, to form an electric/electronic control unit there between the frame and the rear case, a heat spreader module provided between the display panel and the frame, wherein the heat spreader module includes a metallic plate in contact with the display panel, a heat spreading material layer disposed on a rear surface of the metallic plate and an adhesive layer disposed between the heat spreading material layer and the metallic plate to bond the metallic plate and the heat spreading material layer with each other. Even when the frame is partially eliminated, the mobile terminal may support the display panel and securing the heat spreading performance simultaneously, using the heat spreader module having a preset rigidity.

33 Claims, 11 Drawing Sheets

(51) Int. Cl.
*B32B 38/18* (2006.01)
*G06F 1/16* (2006.01)

(58) Field of Classification Search
USPC ............... 361/714, 679.21–679.3, 707, 709,
361/679.55, 679.56; 349/56–60
See application file for complete search history.

(56) References Cited

U.S. PATENT DOCUMENTS

| | | |
|---|---|---|
| 7,336,494 B2 * | 2/2008 | Nishimura ........ G02F 1/133308 313/46 |
| 9,128,685 B2 * | 9/2015 | Choi ..................... G06F 1/203 |
| 2006/0171124 A1 | 8/2006 | Capp et al. |
| 2011/0214851 A1 | 9/2011 | Chen et al. |
| 2011/0316144 A1 | 12/2011 | Yoo et al. |
| 2012/0044635 A1 | 2/2012 | Rothkopf et al. |
| 2013/0082908 A1 | 4/2013 | Lynch et al. |

* cited by examiner

MOBILE TERMINAL AND MANUFACTURING METHOD FOR HEAT SPREADER MODULE

CROSS-REFERENCE TO RELATED APPLICATION

Pursuant to 35 U.S.C. §119(a), this application claims the benefit of earlier filing date and right of priority to Korean Application No. 10-2013-0105302, filed on Sep. 3, 2013, the contents of which are hereby incorporated by reference herein in their entirety.

BACKGROUND

1. Field

Embodiments of the present disclosure relates to a mobile terminal which may maintain a heat spreading performance and realize a slim thickness simultaneously, improving a heat spreader module having a preset rigidity.

2. Background

Generally, terminals can be classified into mobile terminals and stationary terminals. In addition, the mobile terminals can be further classified into handheld terminals and vehicle mount terminals.

Further, a mobile terminal can perform various functions such as data and voice communications, capturing images and video via a camera, recording audio, playing music files and outputting music via a speaker system, and displaying images and video on a display.

There are ongoing efforts to support and increase the functionality of mobile terminals. Such efforts include software and hardware improvements, as well as changes and improvements in the structural components which form the mobile terminal.

It is important to emit the heat generated in the mobile terminal and to lessen the size of the mobile terminal, as a user is carrying the mobile terminal in his or her hand. With a variety of functions, users use such mobile terminals for a longer time and a heat radiation performance is much more important in the mobile terminals. Also, the portability has become a big issue.

SUMMARY OF THE DISCLOSURE

An object of the present disclosure is to provide a mobile terminal which may maintain a heat spreading performance and realize a slim thickness simultaneously, improving a heat spreader module having a preset rigidity.

To achieve these objects and other advantages and in accordance with the purpose of the disclosure, as embodied and broadly described herein, a mobile terminal includes a display panel; a frame comprising a front surface where the display panel is disposed; a rear case coupled to one surface of the frame, to form an electric/electronic control unit there between the frame and the rear case; a heat spreader module provided between the display panel and the frame, wherein the heat spreader module includes a metallic plate in contact with the display panel, a heat spreading material layer disposed on a rear surface of the metallic plate; and an adhesive layer disposed between the heat spreading material layer and the metallic plate to bond the metallic plate and the heat spreading material layer with each other.

The heat spreading material layer may include graphite.

The mobile terminal may further include a cover layer provided on an exposed surface of the heat spreading material layer.

The cover layer may include polyimide or copper.

The heat spreader module may be formed by thermal-compression of the metallic layer, the adhesive layer, the heat spreading material layer and the cover layer disposed sequentially.

Each layer of the heat spreader module may be disposed sequentially in a rolling method.

The size of the heat spreading material layer and the cover layer may, be smaller than the size of the metallic plate in a horizontal or vertical direction, to locate at least one horizontal or vertical end of the heat spreading material layer and the cover layer in an inner portion of the metallic plate.

A corner of the heat spreader module may be rounded.

The metallic layer may be Steel (STS).

The adhesive layer may include a heat conductive material.

A hole or a slit may be formed in at least one of the heat spreading material layer and the metallic layer.

The frame may include a battery mounting portion which penetrates a printed circuit board supporting portion formed in a rear surface, a front surface and a back surface, and the frame may include a battery loaded in the battery mounting portion and a printed circuit board loaded in the printed circuit board supporting portion.

The mobile terminal may further include an adhesive portion disposed between the heat spreader module and the frame to attach the heat spreader module and the frame with each other, wherein an area of the adhesive portion is 1.2% or less with respect to an overall area of the frame.

In another aspect, a manufacturing method of a heat spreader module includes coating an adhesive layer on a metallic layer; laminating a heat spreading material layer on the adhesive layer in a rolling method; laminating a copper layer on the heat spreading material layer in a rolling method; and cutting the laminated metallic layer, adhesive layer, heat spreading material layer and copper layer in a small size.

A roller for laminating the heat spreading material layer may be smaller than a roller for laminating the copper layer and the adhesive layer.

The cutting step may round each corner of the heat spreader module.

According to at least one embodiment of the present disclosure, the heat spreader module having a preset rigidity may be used in supporting the display panel and securing the heat spreading performance simultaneously, even when the frame is partially eliminated.

Furthermore, the frame is partially eliminated such that the thickness of the electric/electronic control unit increased by the battery may be reduced and the overall thickness of the mobile terminal can be reduced accordingly.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

BRIEF DESCRIPTION OF THE DRAWINGS

The embodiments will be described in detail with reference to the following drawings in which like reference numerals refer to like elements wherein.

DETAILED DESCRIPTION

Figure 1:
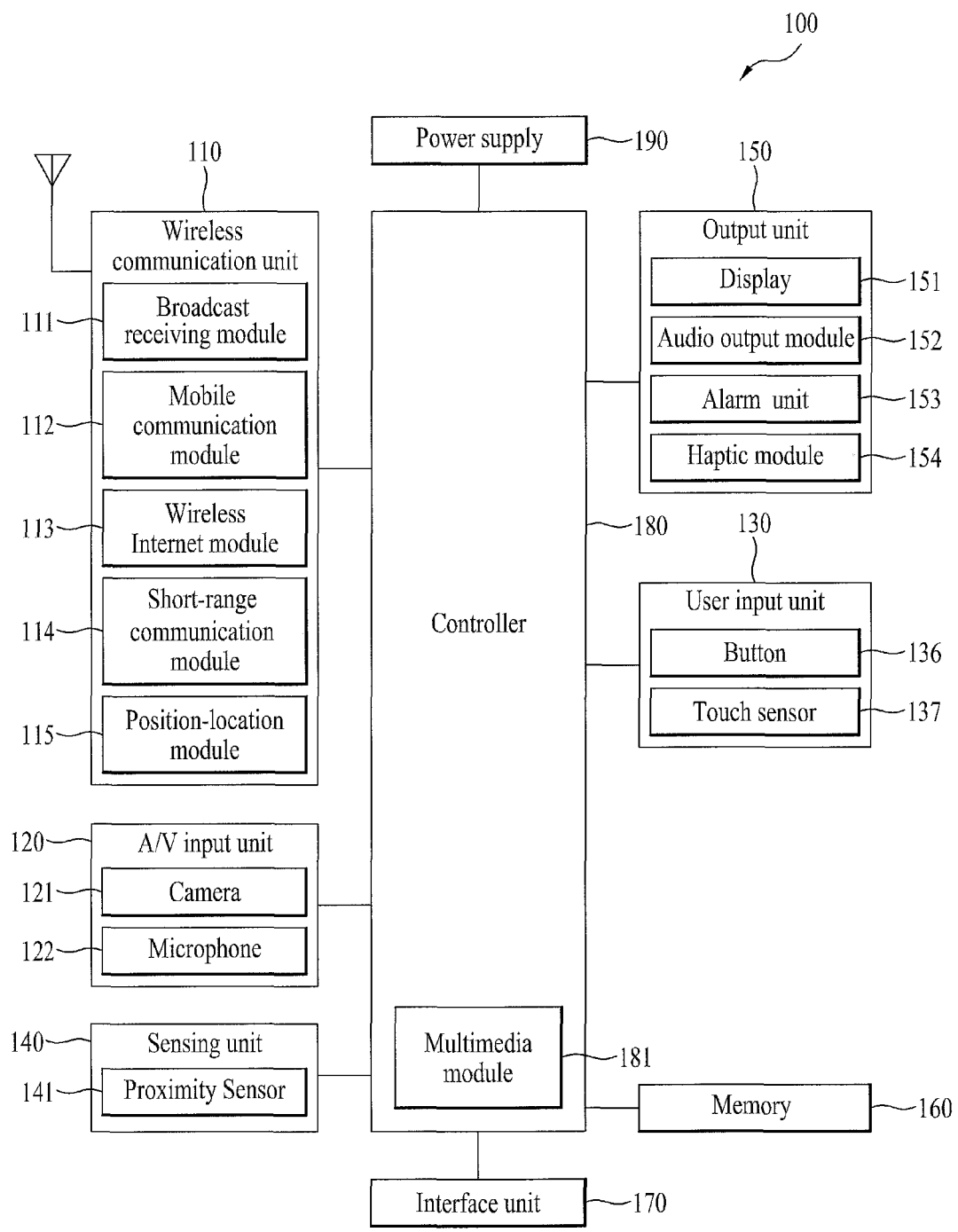
FIG. 1 is a block diagram of a mobile terminal according to one embodiment of the present disclosure.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

The various features described herein may be applicable to a various types of mobile terminals. Examples of such terminals may include mobile phones, user equipments, smart phones, digital broadcast receivers, personal digital assistants, laptop computers, portable multimedia players (PMP), navigators and the like.

Yet, it is apparent to those skilled in the art that a configuration according to an embodiment disclosed in this specification may also be applicable to a fixed terminal such as a digital TV, a desktop computer and the like as well as a mobile terminal.

FIG. 1 is a block diagram of a mobile terminal 100 in accordance with an embodiment as broadly described herein. The mobile terminal 100 may include a wireless communication unit 110, an A/V (audio/video) input unit 120, a user input unit 130, a sensing unit 140, an output unit 150, a memory 160, an interface unit 170, a controller 180, a power supply unit 190 and the like. FIG. 1 shows the mobile terminal 100 having various components, but it is understood that implementing all of the illustrated components is not a requirement. Greater or fewer components may alternatively be implemented.

In the following description, the above elements of the mobile terminal 100 are explained in sequence.

First of all, the wireless communication unit 110 typically includes one or more components which permits wireless communication between the mobile terminal 100 and a wireless communication system or network within which the mobile terminal 100 is located. For instance, the wireless communication unit 110 can include a broadcast receiving module 111, a mobile communication module 112, a wireless internet module 113, a short-range communication module 114, a position-location module 115 and the like.

The broadcast receiving module 111 receives a broadcast signal and/or broadcast associated information from an external broadcast managing server via a broadcast channel. The broadcast channel may include a satellite channel and a terrestrial channel. At least two broadcast receiving modules 111 can be provided to the mobile terminal 100 in pursuit of simultaneous receptions of at least two broadcast channels or broadcast channel switching facilitation.

The broadcast associated information includes information associated with a broadcast channel, a broadcast program, a broadcast service provider, etc. And, the broadcast associated information can be provided via a mobile communication network. In this case, the broadcast associated information can be received by the mobile communication module 112.

The broadcast signal and/or broadcast associated information received by the broadcast receiving module 111 may be stored in a suitable device, such as a memory 160.

The mobile communication module 112 transmits/receives wireless signals to/from one or more network entities (e.g., base station, external terminal, server, etc.) via a mobile network such as GSM (Gobal System for Mobile communications), CDMA (Code Division Multiple Access), WCDMA (Wideband CDMA) and so on. Such wireless signals may represent audio, video, and data according to text/multimedia message transmission and reception, among others.

The wireless internet module 113 supports Internet access for the mobile terminal 100. This module may be internally or externally coupled to the mobile terminal 100. In this case, the wireless Internet technology can include WLAN (Wireless LAN) (Wi-Fi), Wibro (Wireless broadband), Wimax (World Interoperability for Microwave Access), HSDPA (High Speed Downlink Packet Access), GSM, CDMA, WCDMA, LTE (Long Term Evolution), etc.

Wireless internet access by Wibro, HSPDA, GSM, CDMA, WCDMA, LTE or the like is achieved via a mobile communication network. In this aspect, the wireless internet module 113 configured to perform the wireless internet access via the mobile communication network can be understood as a sort of the mobile communication module 112.

The short-range communication module 114 facilitates relatively short-range communications. Suitable technologies for implementing this module include radio frequency identification (RFID), infrared data association (IrDA), ultra-wideband (UWB), as well at the networking technologies commonly referred to as Bluetooth and ZigBee, to name a few.

The position-location module 115 identifies or otherwise obtains the location of the mobile terminal 100. If desired, this module may be implemented with a global positioning system (GPS) module. According to the current technology, the GPS module 115 is able to precisely calculate current 3-dimensional position information based on at least one of longitude, latitude and altitude and direction (or orientation) by calculating distance information and precise time information from at least three satellites and then applying triangulation to the calculated information. Currently, location and time information are calculated using three satellites, and errors of the calculated location position and time information are then amended using another satellite. Besides, the GPS module 115 is able to calculate speed information by continuously calculating a real-time current location.

Referring to FIG. 1, the audio/video (A/V) input unit 120 may be configured to provide audio or video signal input to the mobile terminal 100. As shown, the A/V input unit 120 includes a camera 121 and a microphone 122. The camera 121 receives and processes image frames of still pictures or video, which are obtained by an image sensor in a video call mode or a photographing mode. In addition, the processed image frames can be displayed on the display 151 of the output unit 150.

The image frames processed by the camera 121 can be stored in the memory 160 or can be externally transmitted via the wireless communication unit 110. Optionally, at least two cameras 121 can be provided to the mobile terminal 100 according to environment of usage.

The microphone 122 receives an external audio signal while the portable device is in a particular mode, such as phone call mode, recording mode and voice recognition. This audio signal is processed and converted into electric audio data. The processed audio data is transformed into a format transmittable to a mobile communication base station via the mobile communication module 112 in case of a call mode. The microphone 122 may include assorted noise removing algorithms to remove noise generated in the course of receiving the external audio signal.

The user input unit 130 may generate input data responsive to user manipulation of an associated input device or devices. Examples of such devices include a button 136 provided to front/rear/lateral side of the mobile terminal 100 and a touch sensor (pressure sensitive touch/capacitive touch) 137 and may further include a key pad, a dome switch, a jog wheel, a jog switch and the like.

The sensing unit 140 may provide sensing signals for controlling operations of the mobile terminal 100 using status measurements of various aspects of the mobile terminal 100. For instance, the sensing unit 140 may detect an open/close status of the mobile terminal 100, relative positioning of components (e.g., a display and keypad) of the mobile terminal 100, a change of position of the mobile terminal 100 or a component of the mobile terminal 100, a presence or absence of user contact with the mobile terminal 100, orientation or acceleration/deceleration of the mobile terminal 100. By non-limiting example, such a sensing unit 140 may include a gyro sensor, an acceleration sensor, a geomagnetic sensor and the like.

As an example, consider the mobile terminal 100 being configured as a slide-type mobile terminal. In this configuration, the sensing unit 140 may sense whether a sliding portion of the mobile terminal is open or closed. Other examples include the sensing unit 140 sensing the presence or absence of power provided by the power supply 190, the presence or absence of a coupling or other connection between the interface unit 170 and an external device. In addition, the sensing unit 140 may include a proximity sensor 141.

The output unit 150 may generate outputs relevant to the senses of sight, hearing, touch and the like. The output unit 150 includes the display 151, an audio output module 152, an alarm unit 153, and a haptic module 154 and the like.

The display 151 may be implemented to visually display (output) information associated with the mobile terminal 100. For instance, if the mobile terminal is operating in a phone call mode, the display may provide a user interface (UI) or graphical user interface (GUI) which includes information associated with placing, conducting, and terminating a phone call. As another example, if the mobile terminal 100 is in a video call mode or a photographing mode, the display 151 may additionally or alternatively display images which are associated with these modes, the UI or the GUI.

The display 151 may be implemented using known display technologies including, for example, a liquid crystal display (LCD), a thin film transistor-liquid crystal display (TFT-LCD), an organic light-emitting diode display (OLED), a flexible display and a three-dimensional display. The mobile terminal 100 may include one or more of such displays.

Some of the above displays can be implemented in a transparent or optical transmittable type, which can be named a transparent display. As a representative example for the transparent display, there is TOLED (transparent OLED) or the like. A rear configuration of the display 151 can be implemented in the optical transmittive type as well. In this configuration, a user is able to see an object in rear of a terminal body via the area occupied by the display 151 of the terminal body.

At least two displays 151 may be provided to the mobile terminal 100 in accordance with the implemented configuration of the mobile terminal 100. For instance, a plurality of displays can be arranged on a single face of the mobile terminal 100 in a manner of being spaced apart from each other or being built in one body. Alternatively, a plurality of displays can be arranged on different faces of the mobile terminal 100.

In case that the display 151 and the touch sensor 137 configures a mutual layer structure (hereinafter called 'touch screen'), it is able to use the display 151 as an input device as well as an output device. In this case, the touch sensor may be configured as a touch film, a touch sheet, a touchpad or the like.

The touch sensor 137 can be configured to convert a pressure applied to a specific portion of the display 151 or a variation of a capacitance generated from a specific portion of the display 151 to an electric input signal. Moreover, it is able to configure the touch sensor 137 to detect a pressure of a touch as well as a touched position or size.

If a touch input is made to the touch sensor 137, signal(s) corresponding to the touch is transferred to a touch controller. The touch controller processes the signal(s) and then transfers the processed signal(s) to the controller 180. Therefore, the controller 180 is able to know whether a prescribed portion of the display 151 is touched.

Figure 2:
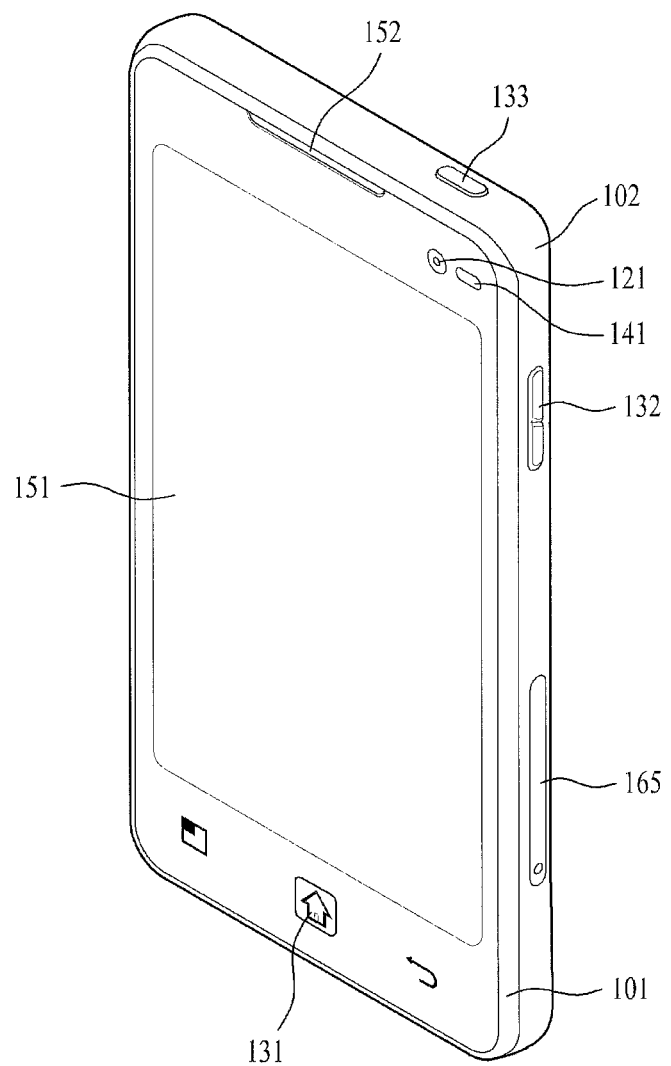
FIG. 2 is a front perspective diagram of a mobile terminal according to one embodiment of the present disclosure.

Referring to FIGS. 1 and 2, a proximity sensor 141 can be provided to an internal area of the mobile terminal 100 enclosed by the touchscreen or around the touchscreen. The proximity sensor 141 is the sensor that detects a presence or non-presence of an object approaching a prescribed detecting surface or an object existing around the proximity sensor using an electromagnetic field strength or infrared ray without mechanical contact. Hence, the proximity sensor has durability longer than that of a contact type sensor and also has utility wider than that of the contact type sensor.

The proximity sensor 141 can include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and the like. In case that the touchscreen includes the electrostatic capacity proximity sensor, it is configured to detect the proximity of a pointer using a variation of electric field according to the proximity of the pointer. In this case, the touchscreen (touch sensor) can be classified as the proximity sensor.

For clarity and convenience of the following description, as a pointer becomes proximate to a touchscreen without coming into contact with the touchscreen, if the pointer is perceived as situated over the touchscreen, such an action shall be named 'proximity touch'. If a pointer actually comes into contact with a touchscreen, such an action shall be named 'contact touch'. A proximity-touched position over the touchscreen with the pointer may mean a position at which the pointer vertically opposes the touchscreen when the touchscreen is proximity-touched with the pointer.

The proximity sensor 141 detects a proximity touch and a proximity touch pattern (e.g., a proximity touch distance, a proximity touch duration, a proximity touch position, a proximity touch shift state, etc.). In addition, information corresponding to the detected proximity touch action and the detected proximity touch pattern can be outputted to the touchscreen.

The audio output module 152 functions in various modes including a call-receiving mode, a call-placing mode, a recording mode, a voice recognition mode, a broadcast reception mode and the like to output audio data which is received from the wireless communication unit 110 or is stored in the memory 160. During operation, the audio output module 152 outputs audio relating to a particular function (e.g., call received, message received, etc.). The audio output module 152 is often implemented using one or more speakers, buzzers, other audio producing devices, and combinations thereof.

The alarm unit 153 is output a signal for announcing the occurrence of a particular event associated with the mobile terminal 100. Typical events include a call received event, a message received event and a touch input received event. The alarm unit 153 is able to output a signal for announcing the event occurrence by way of vibration as well as video or audio signal. The video or audio signal can be output via the display 151 or the audio output unit 152. Hence, the display 151 or the audio output module 152 can be regarded as a part of the alarm unit 153.

The haptic module 154 generates various tactile effects that can be sensed by a user. Vibration is a representative one of the tactile effects generated by the haptic module 154. Strength and pattern of the vibration generated by the haptic module 154 are controllable. For instance, different vibrations can be output in a manner of being synthesized together or can be output in sequence.

The haptic module 154 is able to generate various tactile effects as well as the vibration. For instance, the haptic module 154 generates the effect attributed to the arrangement of pins vertically moving against a contact skin surface, the effect attributed to the injection/suction power of air though an injection/suction hole, the effect attributed to the skim over a skin surface, the effect attributed to the contact with electrode, the effect attributed to the electrostatic force, the effect attributed to the representation of hold/cold sense using an endothermic or exothermic device and the like.

The haptic module 154 can be implemented to enable a user to sense the tactile effect through a muscle sense of finger, arm or the like as well as to transfer the tactile effect through a direct contact. Optionally, at least two haptic modules 154 can be provided to the mobile terminal 100 in accordance with the corresponding configuration type of the mobile terminal 100.

The memory unit 160 is generally used to store various types of data to support the processing, control, and storage requirements of the mobile terminal 100. Examples of such data include program instructions for applications operating on the mobile terminal 100, contact data, phonebook data, messages, audio, still pictures (or photo), moving pictures, etc. In addition, a recent use history or a cumulative use frequency of each data (e.g., use frequency for each phonebook, each message or each multimedia) can be stored in the memory unit 160. Moreover, data for various patterns of vibration and/or sound output in case of a touch input to the touchscreen can be stored in the memory unit 160.

The memory 160 may be implemented using any type or combination of suitable volatile and non-volatile memory or storage devices including hard disk, random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, multimedia card micro type memory, card-type memory (e.g., SD memory, XD memory, etc.), or other similar memory or data storage device. In addition, the mobile terminal 100 is able to operate in association with a web storage for performing a storage function of the memory 160 on Internet.

The interface unit 170 is often implemented to couple the mobile terminal 100 with external devices. The interface unit 170 receives data from the external devices or is supplied with the power and then transfers the data or power to the respective elements of the mobile terminal 100 or enables data within the mobile terminal 100 to be transferred to the external devices.

The interface unit 170 may be configured using a wired/wireless headset port, an external charger port, a wired/wireless data port, a memory card port, a port for coupling to a device having an identity module, audio input/output ports, video input/output ports, an earphone port and/or the like.

The identity module is the chip for storing various kinds of information for authenticating a use authority of the mobile terminal 100 and can include User Identify Module (UIM), Subscriber Identify Module (SIM), Universal Subscriber Identity Module (USIM) and/or the like. A device having the identity module (hereinafter called 'identity device') can be manufactured as a smart card. Therefore, the identity device is connectible to the mobile terminal 100 via the corresponding port.

When the mobile terminal 100 is connected to an external cradle, the interface unit 170 becomes a passage for supplying the mobile terminal 100 with a power from the cradle or a passage for delivering various command signals input from the cradle by a user to the mobile terminal 100. Each of the various command signals input from the cradle or the power can operate as a signal enabling the mobile terminal 100 to recognize that it is correctly loaded in the cradle.

The controller 180 may control the overall operations of the mobile terminal 100. For example, the controller 180 may performs the control and processing associated with voice calls, data communications, video calls, etc. The controller 180 may include a multimedia module 181 that provides multimedia playback. The multimedia module 181 may be configured as part of the controller 180, or implemented as a separate component.

Moreover, the controller 180 is able to perform a pattern (or image) recognizing process for recognizing a writing input and a picture drawing input carried out on the touchscreen as characters or images, respectively.

The power supply unit 190 provides power required by the various components for the mobile terminal 100. The power may be internal power, external power, or combinations thereof.

A battery may include a built-in rechargeable battery and may be detachably attached to the terminal body for a charging and the like. A connecting port may be configured as one example of the interface 170 via which an external charger for supplying a power of a battery charging is electrically connected.

Various embodiments described herein may be implemented in a computer-readable medium using, for example, computer software, hardware, or some combination thereof.

Next, FIG. 2 is a front perspective diagram of a mobile terminal according to one embodiment of the present disclosure.

The mobile terminal 100 shown in the drawing has a bar type terminal body. Yet, the mobile terminal 100 may be implemented in a variety of different configurations. Examples of such configurations include folder-type, slide-type, rotational-type, swing-type and combinations thereof. For clarity, further disclosure will primarily relate to a bar-type mobile terminal 100. However such teachings apply equally to other types of mobile terminals.

Referring to FIG. 2, the mobile terminal 100 includes a case 101, 102, 103 configuring an exterior thereof. In the present embodiment, the case can be divided into a front case 101 and a rear case 102. Various electric/electronic parts are loaded in a space provided between the front and rear cases 101 and 102.

Occasionally, electronic components can be mounted on a surface of the rear case 102. The electronic part mounted on the surface of the rear case 102 may include such a detachable part such as a battery, a USIM card, a memory card and the like. In doing so, the rear case 102 may further include a backside cover 103 (see FIG. 3) configured to cover the surface of the rear case 102. In particular, the backside cover 103 has a detachable configuration for the user's convenience. If the backside cover 103 is detached from the rear case 102, the surface of the rear case 102 is exposed.

Figure 3:
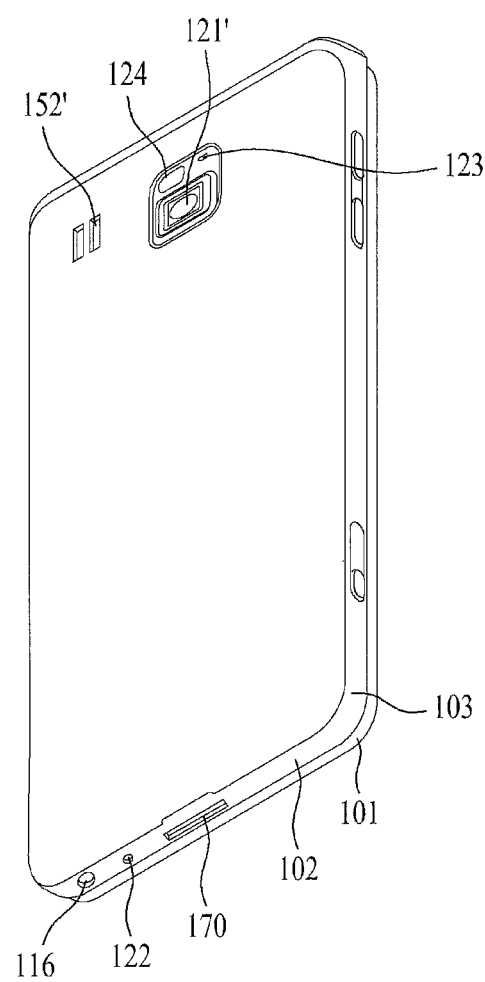
FIG. 3 is a rear perspective diagram of a mobile terminal according to one embodiment of the present disclosure.

Referring to FIG. 3, if the backside cover 103 is attached to the rear case 102, a lateral side of the rear case 102 may be exposed in part. If a size of the backside cover 103 is decreased, a rear side of the rear case 102 may be exposed in part. If the backside cover 103 covers the whole rear side of the rear case 102, it may include an opening 103' (see FIG. 4) configured to expose a camera 121' or an audio output unit 152' externally.

The cases 101, 102 and 103 can be formed by injection molding of synthetic resin or can be formed of metal substance such as stainless steel (STS), titanium (Ti) or the like for example.

A display 151, an audio output unit 152, a camera 121, user input units 130/131 and 132, a microphone 122, an interface 170 and the like can be provided to the case 101 or 102.

The display 151 occupies most of a main face of the front case 101. The audio output unit 152 and the camera 121 are provided to an area adjacent to one of both end portions of the display 151, while the user input unit 131 and the microphone 122 are provided to another area adjacent to the other end portion of the display 151. The user input unit 132 and the interface 170 can be provided to lateral sides of the front and rear cases 101 and 102.

The input unit 130 is manipulated to receive a command for controlling an operation of the terminal 100. And, the input unit 130 is able to include a plurality of manipulating units 131 and 132. The manipulating units 131 and 132 can be named a manipulating portion and may adopt any mechanism of a tactile manner that enables a user to perform a manipulation action by experiencing a tactile feeling.

Content input by the first or second manipulating unit 131 or 132 can be diversely set. For instance, such a command as start, end, scroll and the like is input to the first manipulating unit 131. In addition, a command for a volume adjustment of sound output from the audio output unit 152 and the like can be input to the second manipulating unit 132, a command for a switching to a touch recognizing mode of the display 151 and the like can be input to the third manipulating unit 133.

A button type is configured to recognize a pressure applied by a user to each of the manipulation units 131, 132 and 133. If a touch sensor is provided to each of the manipulation units 131, 132 and 133 in addition to the display unit 151, a user's command can be inputted by a user's touch.

FIG. 3 is a perspective diagram of a backside of the terminal shown in FIG. 2.

Referring to FIG. 3, the camera 121' can be additionally provided to a backside of the terminal body, and more particularly, to the rear case 102. The camera 121 has a photographing direction that is substantially opposite to that of the former camera 121 shown in FIG. 2 and may have pixels differing from those of the firmer camera 121.

Preferably, for instance, the camera 121 has low pixels enough to capture and transmit a picture of user's face for a video call, while the latter camera 121' has high pixels for capturing a general subject for photography without transmitting the captured subject. In addition, each of the cameras 121 and 121' can be installed at the terminal body to be rotated or popped up.

A flash 123 and a mirror 124 are additionally provided adjacent to the camera 121'. The flash 123 projects light toward a subject in case of photographing the subject using the camera 121'. In case that a user attempts to take a picture of the user (self-photography) using the camera 121', the mirror 124 enables the user to view user's face reflected by the mirror 124.

The additional audio output unit 152' can be provided to the backside of the terminal body. The additional audio output unit 152' is able to implement a stereo function together with the former audio output unit 152 shown in FIG. 2A and may be used for implementation of a speakerphone mode in talking over the terminal.

A broadcast signal receiving antenna 116 can be additionally provided to the lateral side of the terminal body as well as an antenna for communication or the like. The antenna 116 constructing a portion of the broadcast receiving module 111 shown in FIG. 1 can be retractably provided to the terminal body.

Figure 4:
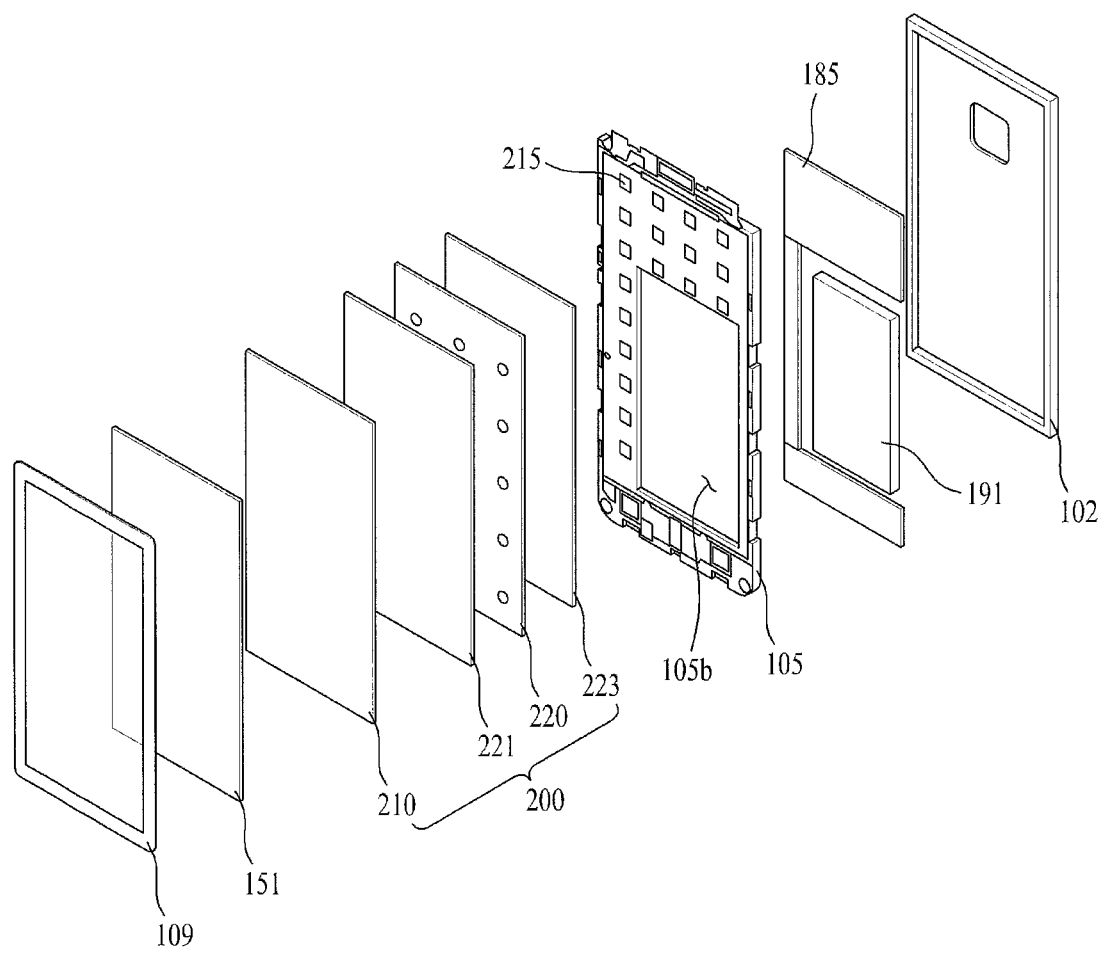
FIG. 4 is an exploded perspective diagram of a mobile terminal according to one embodiment of the present disclosure.

FIG. 4 is an exploded perspective diagram of a mobile terminal 100 according to one embodiment. The mobile terminal 100 includes a window glass 109, a display panel 151, a heat spreader module 200, a frame 105, a printed circuit board 185, a battery and a rear case 102.

The display panel 151 is disposed in a front surface of the mobile terminal. Recently, a touch sensor is disposed on the display panel 151 to perform even an input function as well as an output function and the display panel 151 is getting larger.

The window glass 109 is configured to protect a front surface of the display panel 151. Once a touch sensor is disposed on the window glass 109, the window glass 109 is disposed on the display panel 151 such that the display panel 151 having a touch input function may be provided.

In a conventional mobile terminal, the display panel 151 is disposed in the frame 105 and a front case covers a front surface of the display panel 151. However, such the front case is omitted to minimize a size of a bezel recently as shown in FIG. 4. Also, the window glass 109 covers the front surface of the display panel 151 and the display 151 is disposed in the frame 105.

A camera 121, a receiver 152, a microphone 122 and the like which are typically mounted in the front case of the conventional mobile terminal may be mounted in a space formed between the frame 105 and the rear case 102, in other words, an electric/electronic control unit. The frame 105 may be fabricated of an alloy including magnesium. The frame fabricated of the alloy including the magnesium has an advantage of a sufficient rigidity with a light weight.

Figure 5:
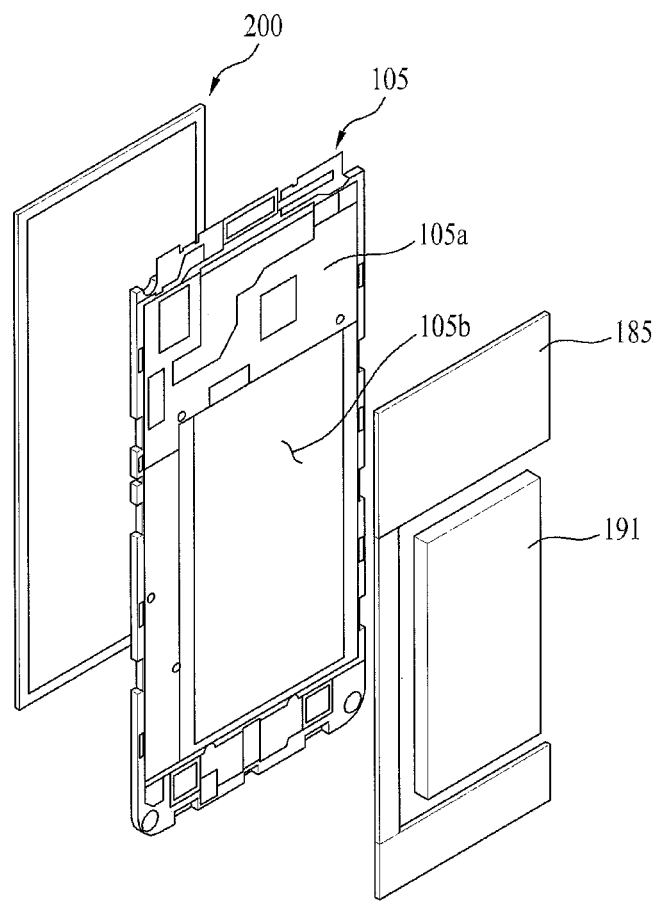
FIG. 5 is an exploded perspective diagram illustrating a frame, a heat spreading material, a printed circuit board and a battery provided in a mobile terminal according to one embodiment of the disclosure.

A front surface of the frame 105 includes a flat portion to support the display panel 151 and a rear surface thereof has an uneven portion to mount the part shown in FIG. 5 therein. The rear surface of the frame 105 includes a battery mounting portion 105a for mounting the batter 191 therein and a circuit board supporting portion 105b for loading the printed circuit board 185 therein.

The rear case 102 may be coupled to the rear surface of the frame 105, to form the electric/electronic control unit between the frame 105 and the rear case 102. Not only the battery 191 and the printed circuit board 185 but also, the camera 121, the receiver 152 and the microphone and the like may be mounted in the electric/electronic control unit.

With the trend of a slim mobile terminal 100, it is necessary to lessen the thickness of the electric/electronic control unit. The battery 191 out of the parts mounted in the electric/electronic control unit is the thickest and the electric/electronic control unit needs to be as thick as or thicker than the battery 191.

Figure 6:
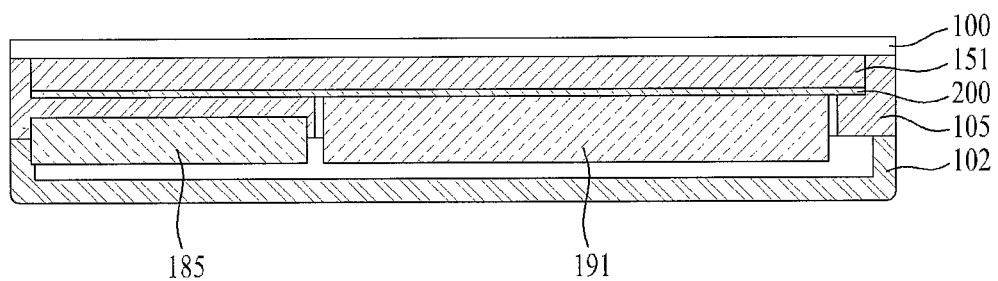
FIG. 6 is a sectional diagram of a mobile terminal according to one embodiment of the disclosure.

The portion where the battery 191 is mounted may be open to the frame 105 to form the battery mounting portion 105a. Referring to FIG. 6 which is the sectional diagram of a mobile terminal 100 according to one embodiment of the disclosure, the battery 191 is loaded in the battery mounting portion 105a of the frame 105 and the thickness of the electric/electronic control unit can be reduced as much as the thickness of the frame 105.

In this instance, there is a disadvantage that the supporting structure between the battery 191 and the display panel 151 c is removed. To solve such a disadvantage, a heat spreader module 200 according to the present embodiment has rigidity and the heat spreader module 200 is provided between the display panel 151 and the battery mounting portion 105a to support a rear surface of the display panel 151.

The heat spreader module 200 is provided between the frame 105 and the display panel 151 to spread the heat generated in the mobile terminal 100. Much heat is generated in the printed circuit board 185 where various electric/electronic devices for controlling the mobile terminal 100 are mounted. A cooler may be used in an electronic device having a preset or more size such as a computer. However, a cooling fan cannot be mounted in the mobile terminal 100 in an aspect of portability and a high heat conductive module may be disposed in the mobile terminal 100 to spread the heat generated in a specific portion of the mobile terminal.

The heat spreader module 200 according to the embodiments is characterized by possession of a predetermined rigidity. In a conventional heat spreading film, Polyethylene Terephthalate (PEP) is disposed on one surface of graphite material and an adhesion film 221 is disposed on the other surface. After that, the heat spreading film having the multilayer structure is attached to the frame 105 like a tape. At this time, a metallic or heat-conductive material may be contained in the adhesion layer film 221 to prevent heat spreading from being deteriorated by the adhesion film 221.

However, in the heat spreader module 200, a heat spreading film 220 such as a graphite material is disposed on metallic plate 210 having a preset rigidity such as STS and then resin 211 is disposed between the heat spreading film 220 and the metallic plate 210. After that, a thermal compression bonding method is performed to complete the heat spreader module 200. The heat spreading film 220 may be formed of copper or silver having a good heat conductivity as well as graphite.

The heat spreading material layer 220 formed of graphite could be damaged easily. To protect the heat spreading material layer 220, a cover later 223 may be further disposed on the other surface of the heat spreading material layer 220 not coupled to the metallic plate 210.

The cover layer 223 may be formed of polyimide to make the heat spreading material layer 220 protected and as thin as possible. The polyimide has a high heat-resisting property and less dimensional change, with a high rub resistance.

When the heat spreading material layer 220 and the metallic plate 210 are thermally compressed, bubble could be generated to partially space them apart from each other. Such bubble can make surfaces uneven and an air layer could deteriorate the heat spreading performance. To prevent the bubble, a hole 222 and 221 or a slit 221 may be formed at least one of the heat spreading material layer 220 and the metallic plate 210.

Figure 7A:
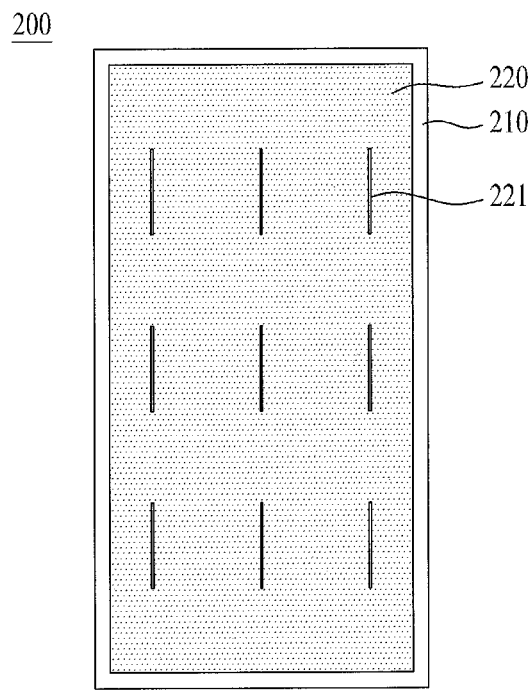
FIGS. 7a through 7c are diagrams illustrating various embodiments of a heat spreader module provided in a mobile terminal according to one embodiment of the disclosure.
Figure 7B:
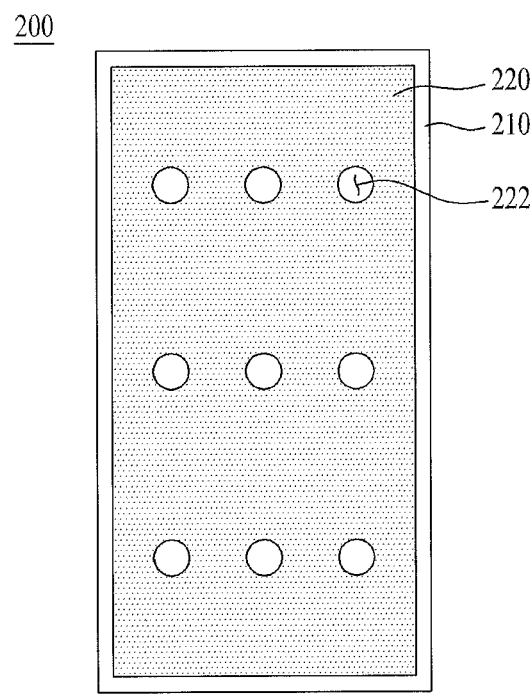
Figure 7C:
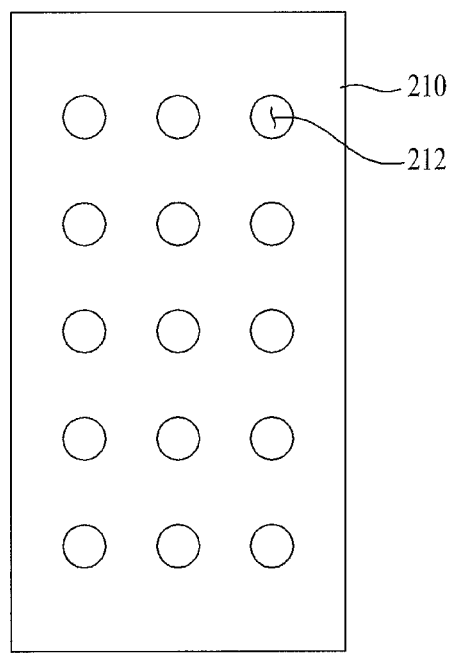

FIG. 7a illustrating a rear view illustrating one embodiment of the heat spreader module 200 and it is shown that a slit 221 is formed in the heat spreader material film 220. FIG. 7b is a rear view illustrating another embodiment of the heat spreader module 200 and it is shown that a hole 222 is formed in the heat spreading material layer 220. FIG. 7c is a front view illustrating that a hole 212 is formed in the metallic plate 210, not the heat spreader module 200.

As shown in FIGS. 7a, 7b and 7c, the hole 222 and 212 or the slip 221 is formed in the metallic plate 210 or the heat spreading material layer 220, such that the bubble generated between the metallic plate 210 and the heat spreading material layer 220 during the thermal compression process may be exhausted through the hole 222 and 212 or the slit 221.

When the heat spreading material layer 220 and the cover later 223 fabricated to have the same size as the metallic plate 210 are provided in the same position as the metallic plate 210, there might be a disadvantage that the heat spreading material layer 220 and the cover layer 223 are separated from the metallic layer 210. To prevent the disadvantage, the heat spreading material layer 220 and the cover layer 223 shown in FIGS. 7a and 7b are formed a little smaller than the metallic plate 210 to locate ends of the heat spreading material layer 220 and the cover layer 223 in inner portions than ends of the metallic plate 210.

Copper may be used for the cover layer as well as polyimide. When using copper, the cover layer might be substantially thicker than the cover layer formed of polyimide but it could enhance the rigidity of the heat spreader module, together with the metallic plate 210. With high heat conductivity, copper may enhance the heat sinking efficiency of the heat spreader module 200 together with the heat spreading material 220.

In case of the cover layer 223 formed of copper, it may be preferred to uses a rolling method, not the thermal compression bonding mentioned above. In such a rolling method, a thin film typed material is wound in a roll type and the rolled film is unrolled to dispose a material of the thin film sequentially.

Figure 8:
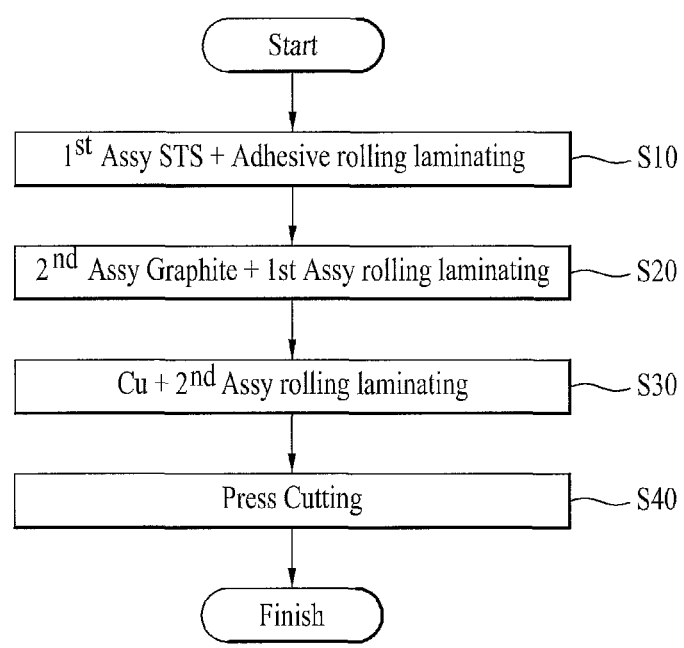
FIG. 8 is a flow chart illustrating a manufacturing method of a heat spreader module provided in a mobile terminal according to one embodiment of the disclosure.

FIG. 8 is a flow chart illustrating a method for manufacturing a heat spreader module 200 in a rolling method. An adhesive is coated on a metallic layer (STS) 210 to form an adhesion layer 221 (S10). The coating of the adhesive may make a double sided tape bonded to STS in a rolling method. A graphite material 220 is laminated to a first assembly having the adhesion layer 221 laminated on the STS in a rolling method and then a second assembly (2nd Assy) is formed (S20). The copper layer 223 is laminated on the second assembly (S30). The material of the heat spreader module laminated in the rolling method is manufactured in a long tape shape and then cut in a preset size (S40), such that the heat spreader module 200 may be manufactured.

In the rolling method mentioned above, the graphite material and the copper layer are disposed on the STS moving in one direction, such that the heat spreader module 200 may be manufactured in a long tape shape. As shown in FIG. 7*a* or 7*b*, it is difficult to locate four lateral surfaces of the heat spreading material layer 220 and the cover layer 223 in an inner portion than the ends of the metallic layer 210.

Figure 9A:
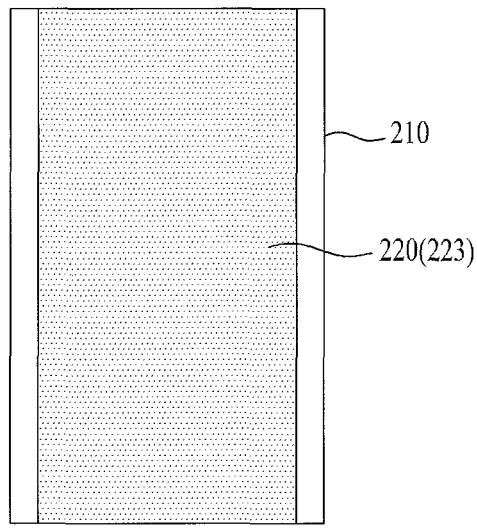
FIGS. 9a through 9c are diagrams illustrating various embodiments of a heat spreader module provided in a mobile terminal according to one embodiment of the disclosure.
Figure 9B:
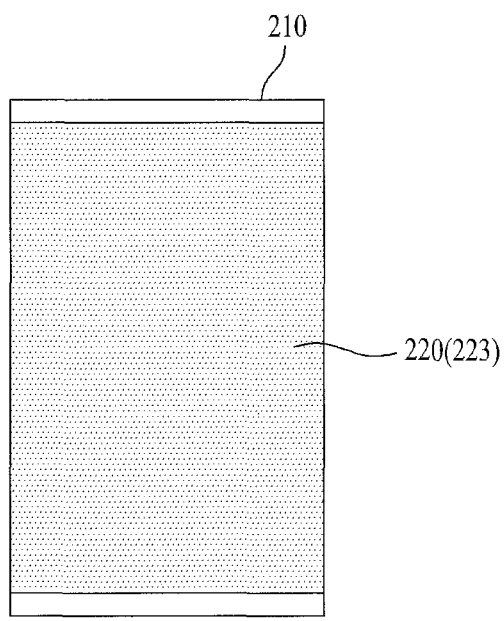

Accordingly, as shown in FIGS. 9*a* and 9*b*, a vertical (an upward/downward direction) or a horizontal direction (a right-and-left direction) of the heat spreading material layer 220 and the cover layer 223 may be arranged closer to the inner portion than the ends of the metallic layer 210 and the other directions may be arranged in the same position as the ends of the metallic layer 210.

Figure 9C:
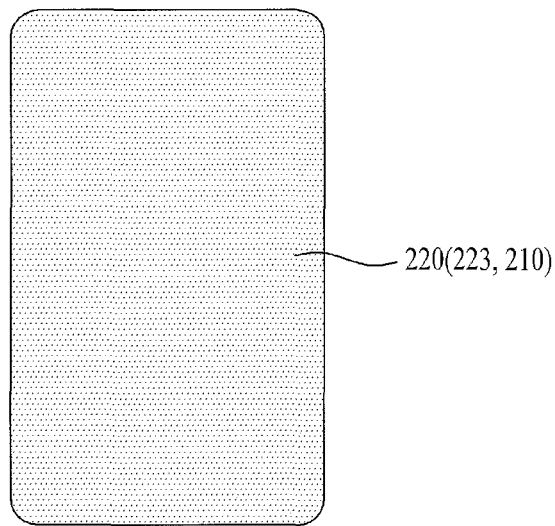

When a corner portion is rounded as shown in FIG. 9, each of the layers disposed in the heat spreader module 200 may be prevented from separating from each other. When the ends are rounded, the heat spreading material layer 220 and the cover layer 223 are prevented from separating from the metallic layer 210, even without locating the ends of the heat spreading material layer 220 and the cover layer 223 in the inner portion.

To bond the heat spreader module 200 to the frame 105, an adhesive tape 215 shown in FIG. 4 may be used. When it is disposed on the entire portion of the heat spreader module 200, the adhesive tape 215 has a disadvantage of deteriorating the heat sinking performance because the heat generated from the printed circuit board 185 from failed to be sent to the heat spreading material layer 220.

When the small sized adhesive bonding the adhesive tape 215 is attached to a 1.2% or less area of the heat spreading material layer 220, spaced apart as shown in FIG. 4, there is little temperature difference in comparison with the heat spreading material layer having no adhesive tape 215 such that the heat radiation function can be kept.

Figure 10:
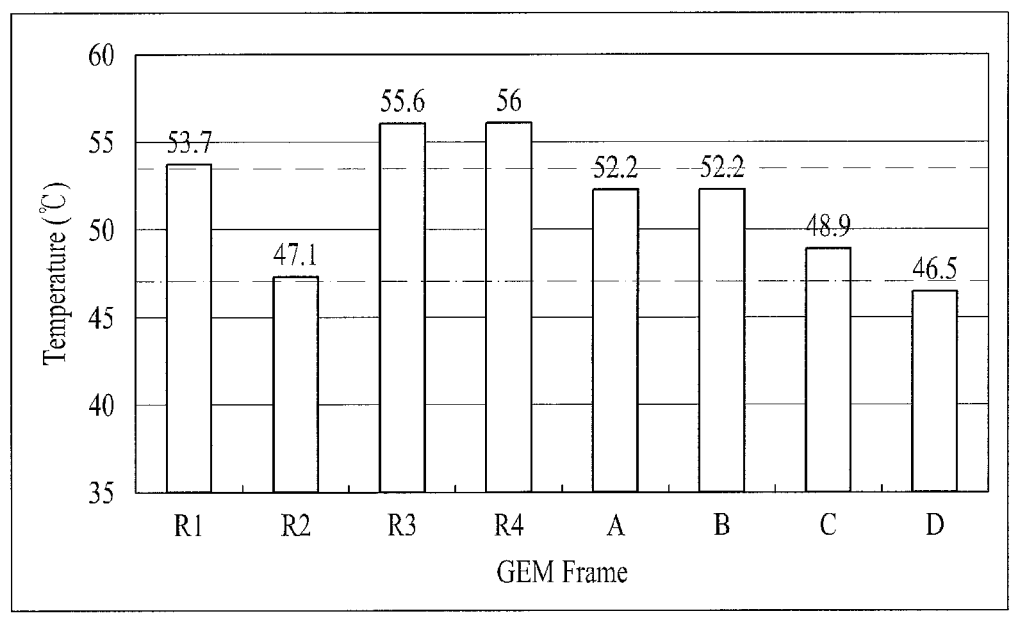
FIGS. 10 and 11 are graphs illustrating a result of comparison of heat spreading performances in a mobile terminal according to one embodiment of the disclosure.

To test the heat radiation function based on the structures of the frame 105, a temperature is measured on the other surface of the frame 105 when a 3.4 W LED disposed on one surface is driven. FIG. 10 is a graph comparing the heat spreading function in eight structures which combine the frame 105 and the heat spreader module 200.

"R1" is a frame 105 containing magnesium with no open battery mounting portion 105*a* and "R2" is a frame 105 having 2.5 mm artificial graphite disposed thereon. "R3" is a frame 105 containing magnesium having an open battery mounting portion 105*a* and "R4" is R3 having a 0.1 mm STS (Steel) disposed thereon.

"A" is the frame 105 of R3 having an 0.05 mm copper layer, with 0.1 mm STS (Steel) disposed thereon and "B" is the frame 105 of R3 having the open battery mounting portion 105*a* and 0.05 mm natural graphite and 0.1 mm STS (Steel) disposed thereon.

"C" is the frame 105 of R3 having the open battery mounting portion 105*a*, with 0.025 mm artificial graphite and 0.1 mm STS(Steel) disposed thereon. "D" is R3 having the open battery mounting portion 105*a*, with 2 layers of 0.025 mm artificial graphite and 0.1 mm STS(Steel) disposed thereon.

When the frame 105 of the battery mounting portion 105*a* is omitted, the heat spreading performance is getting as slow as much and the temperature of R3 is higher than the temperature of R1. However, when the heat spreader module 200 according to the embodiments is provided as A, B, C and D, the temperatures may be lowered by 3▢.

"A" uses copper as the heat spreading material layer 220 and "B" uses natural graphite. "C" and "D" use artificial graphite. Compared with the copper and the natural graphite, the heat spreading efficiency is high and the thickness is smaller in the artificial graphite. To secure the heat spreading efficiency and reduce the slim thickness, the heat spreader module 200 and the frame 105 of "C" may be used.

Figure 11:
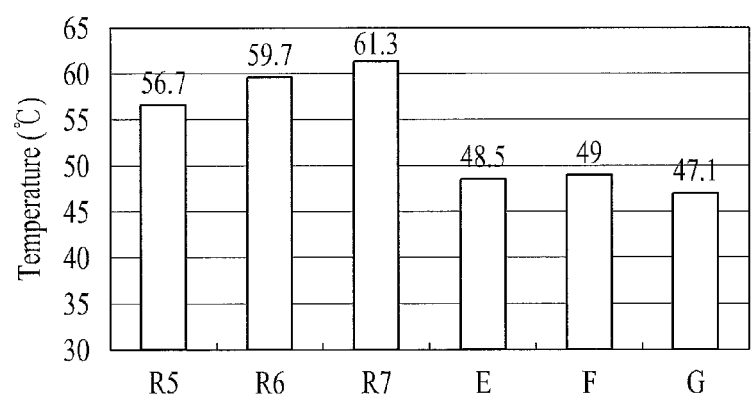

FIG. 11 is a comparison graph for identifying the heat radiation function, in case of using copper as the cover layer. "R5" refers to a heat radiation function of a magnesium frame and "R6" refers to a heat radiation function of a magnesium frame double-injected in an aluminum plate. "R7" refers to a heat radiation function of a magnesium frame having an open battery mounting portion 105*a*.

"R8" refers to a heat radiation function of the frame of R7 having only the graphite disposed thereon. "E" and "F" refer to heat radiation functions of a frame having an open battery mounting portion 105*a*, with a heat spreader module 220 having a graphite material layer 220 and a copper cover layer 223 disposed on STS 210.

"E" refers to a heat radiation function in a state where a copper cover layer 223 is arranged toward a display 151. "F" refers to a heat radiation function in a state where the copper cover layer 223 is arranged toward a battery 191. As a heat conductivity of copper is higher than a heat conductivity of STS, a heat radiation function of copper is a little bit better than a heat radiation function of STS. Yet, both of them have excellent heat spreading performances and they may secure sufficient reliability of the heat radiation performance applicable to actual products.

Compared with the heat spreading performance of the conventional frame, R7, E and F having the graphite layer have good heat radiation efficiency. When only graphite is disposed on the frame, the rear surface of the battery mounting portion 105*a* cannot be supported. Accordingly, it is preferred that the heat spreader module 200 including the metallic layer 220 and the cover layer 223 shown in E and F is used.

As mentioned above, according to at least one of the embodiments, the heat spreader module 200 having a preset rigidity may be used in supporting the display panel 151 and securing the heat spreading performance simultaneously, even when the frame 105 is partially eliminated.

Furthermore, the frame 105 is partially eliminated such that the thickness of the electric/electronic control unit increased by the battery may be reduced and the overall thickness of the mobile terminal can be reduced accordingly.

Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic device comprising:
    a display panel including a front surface and a rear surface;
    a window configured to protect the front surface of the display panel;
    a frame including a front surface of the frame to support the display panel and a rear surface of the frame;
    wherein the front surface of the frame has a flat surface,
    wherein the rear surface of the frame includes a battery mounting portion for providing a battery therein and a circuit board supporting portion for providing a circuit board therein,
    wherein the battery mounting portion of the frame includes an opening,
    a heat spreader disposed between the rear surface of the display panel and the front surface of the frame, wherein the heat spreader includes a graphite layer and a copper layer, and wherein the graphite layer includes at least one hole or at least one slit.

2. The electronic device according to claim 1, wherein the heat spreader is located such that the copper layer is arranged toward the back surface of the display panel.

3. The electronic device according to claim 1, wherein the heat spreader is located such that the copper layer is arranged toward the front surface of the frame.

4. The electronic device according to claim 1, wherein the at least one hole or at least one slit is arranged in a matrix array.

5. The electronic device according to claim 1, wherein a corner portion of the heat spreader is rounded.

6. The electronic device according to claim 1, further comprising:
    a rear case coupled to the rear surface of the frame.

7. The electronic device according to claim 1, further comprising an adhesive tape disposed between the heat spreader and the frame so as to bond the heat spreader and the frame.

8. The electronic device according to claim 7, wherein the adhesive tape is attached to a 1.2% or less of an area of the heat spreader.

9. The electronic device according to claim 1, wherein the display panel includes an organic light-emitting diode display (OLED).

10. The electronic device according to claim 1, wherein the battery includes a built-in rechargeable battery.

11. The electronic device according to claim 1, wherein the heat spreader includes:
    a metallic plate having a preset rigidity and disposed on a surface of the graphite layer not coupled to the copper layer.

12. The electronic device according to claim 11, wherein a size of the graphite layer and the copper layer is smaller than a size of the metallic plate in a horizontal direction or a vertical direction of a surface of the layer.

13. The electronic device according to claim 11, the metallic plate comprises steel.

14. The electronic device according to claim 1, wherein the heat spreader includes:
    an adhesive layer between the graphite layer and the metallic plate to bond the metallic plate to the graphite layer.

15. The electronic device according to claim 1, wherein the adhesive layer includes a heat conductive material.

16. The electronic device according to claim 1, wherein the frame includes magnesium or magnesium alloy.

17. An electronic device comprising:
    a display panel;
    a window on a surface of the display panel;
    a frame including a front surface adjacent to the display panel and a rear surface;
    wherein a portion of the front surface is flat,
    wherein the rear surface includes a battery mounting portion and a circuit board supporting portion, wherein the battery mounting portion includes an area to receive a battery; and
    a heat spreader between the display panel and the front surface of the frame, wherein the heat spreader includes a graphite portion and a copper portion, wherein the graphite portion includes at least one hole or at least one slit.

18. The electronic device according to claim 17, wherein the area of the battery mounting portion includes an opening.

19. The electronic device according to claim 17, wherein the copper portion is arranged toward the display panel.

20. The electronic device according to claim 17, wherein the copper portion is arranged toward the front surface of the frame.

21. The electronic device according to claim 17, wherein the at least one hole or at least one slit is arranged in a matrix array.

22. The electronic device according to claim 17, wherein a corner portion of the heat spreader is rounded.

23. The electronic device according to claim 17, further comprising:
a rear case coupled to the rear surface of the frame.

24. The electronic device according to claim 17, further comprising an adhesive tape disposed between the heat spreader and the frame so as to bond the heat spreader and the frame.

25. The electronic device according to claim 24, wherein the adhesive tape is attached to a 1.2% or less of an area of the heat spreader.

26. The electronic device according to claim 17, wherein the display panel includes an organic light-emitting diode display (OLED).

27. The electronic device according to claim 17, comprising a built-in rechargeable battery.

28. The electronic device according to claim 17, wherein the heat spreader includes:
a metallic plate having a preset rigidity and disposed on a surface of the graphite portion not coupled to the copper portion.

29. The electronic device according to claim 28, wherein a size of the graphite portion and the copper portion is smaller than a size of the metallic plate in a horizontal direction or a vertical direction.

30. The electronic device according to claim 28, wherein the metallic plate comprises steel.

31. The electronic device according to claim 28, wherein the heat spreader includes:
an adhesive layer between the graphite portion and the metallic portion to bond the metallic plate to the graphite portion.

32. The electronic device according to claim 17, wherein the adhesive layer includes a heat conductive material.

33. The electronic device according to claim 17, wherein the frame includes magnesium or magnesium alloy.

* * * * *